(12) United States Patent
Kamiya et al.

(10) Patent No.: US 11,127,826 B2
(45) Date of Patent: Sep. 21, 2021

(54) SEMICONDUCTOR DEVICE

(71) Applicant: DENSO CORPORATION, Kariya (JP)

(72) Inventors: Masayuki Kamiya, Toyota (JP); Takanori Kawashima, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/910,424

(22) Filed: Jun. 24, 2020

(65) Prior Publication Data

US 2020/0411653 A1 Dec. 31, 2020

(30) Foreign Application Priority Data

Jun. 27, 2019 (JP) .............................. JP2019-120343

(51) Int. Cl.
*H01L 29/423* (2006.01)
*H01L 29/78* (2006.01)
*H01L 29/16* (2006.01)

(52) U.S. Cl.
CPC ...... *H01L 29/4232* (2013.01); *H01L 29/1608* (2013.01); *H01L 29/78* (2013.01)

(58) Field of Classification Search
CPC .. H01L 29/78; H01L 29/1608; H01L 29/4232
USPC ......................................................... 257/77
See application file for complete search history.

(56) References Cited

U.S. PATENT DOCUMENTS

| 2005/0199999 | A1 | 9/2005 | Shirasawa et al. |
| 2007/0284743 | A1* | 12/2007 | Choi ....................... H01L 27/24 257/751 |
| 2012/0007035 | A1* | 1/2012 | Jo .......................... H01L 45/085 257/4 |
| 2018/0226360 | A1 | 8/2018 | Kamiya |
| 2019/0013261 | A1* | 1/2019 | Shiizaki ............ H01L 23/49568 |

FOREIGN PATENT DOCUMENTS

| JP | 2005-259753 A | 9/2005 |
| JP | 2018-129388 A | 8/2018 |

* cited by examiner

*Primary Examiner* — Igwe U Anya
(74) *Attorney, Agent, or Firm* — Sughrue Mion, PLLC (57) ABSTRACT

A semiconductor device may include a semiconductor substrate, an upper electrode provided on an upper surface of the semiconductor substrate, a lower electrode provided on a lower surface of the semiconductor substrate, and a terminal connected to the upper electrode. The semiconductor substrate may include an active region in which switching elements are provided. The switching elements may be configured to pass a current between the upper electrode and the lower electrode. The active region may include a main region located under the terminal and an external region located outside the main region. The external region may include a low current region. A current density in the low current region may be lower than a current density in the main region in a case where the switching elements in the low current region and the main region are turned on.

8 Claims, 7 Drawing Sheets

SEMICONDUCTOR DEVICE

CROSS-REFERENCE TO RELATED APPLICATION

This application claims priority to Japanese Patent Application No. 2019-120343 filed on Jun. 27, 2019, the contents of which are hereby incorporated by reference into the present application.

TECHNICAL FIELD

The technology disclosed herein relates to a semiconductor device.

BACKGROUND

Japanese Patent Application Publication No. 2018-129388 describes a semiconductor device that includes a semiconductor substrate, an upper electrode provided on an upper surface of the semiconductor substrate, a lower electrode provided on a lower surface of the semiconductor substrate, and a terminal (copper block) connected to the upper electrode. The semiconductor substrate includes an active region in which switching elements configured to pass a current between the upper electrode and the lower electrode are provided. Generally, such active region is provided only under and near the terminal. Thus, when the active region generates heat due to a current flowing in the switching elements, the heat is dissipated from the active region by the terminal. Temperature increase in the active region is thereby suppressed.

SUMMARY

In order to enlarge an active region, the active region can be expanded to an area outside the terminal (area that is not covered by the terminal). However, if the active region is expanded to the area outside the terminal, heat generated in the area is less likely to be transferred to the terminal. Thus, part of the active region that is provided outside the terminal tends to have a higher temperature than part of the active region that is provided under the terminal. This may result in that a current is no longer allowed to flow through the semiconductor device, despite the part of the active region under the terminal (main region) having not yet reached a very high temperature. The disclosure herein proposes a semiconductor device in which an active region is provided in an area outside a terminal and that allows a high current to flow therethrough.

A semiconductor device disclosed herein may comprise a semiconductor substrate, an upper electrode provided on an upper surface of the semiconductor substrate, a lower electrode provided on a lower surface of the semiconductor substrate, and a terminal connected to the upper electrode. The semiconductor substrate may comprise an active region in which switching elements are provided. The switching elements may be configured to pass a current between the upper electrode and the lower electrode. The active region may comprise a main region located under the terminal and an external region located outside the main region. The external region may comprise a low current region. A current density in the low current region may be lower than a current density in the main region in a case where the switching elements in the low current region and the main region are turned on.

In this configuration, the current density in the low current region (region outside the terminal) is lower than the current density in the main region when the switching elements in the main region and the low current region are simultaneously turned on. This suppresses heat generation in the low current region, and temperature increase in the low current region is thereby suppressed. Thus, the semiconductor device can allow a high current to flow until the main region reaches a high temperature.

DETAILED DESCRIPTION

First Embodiment

Figure 1:
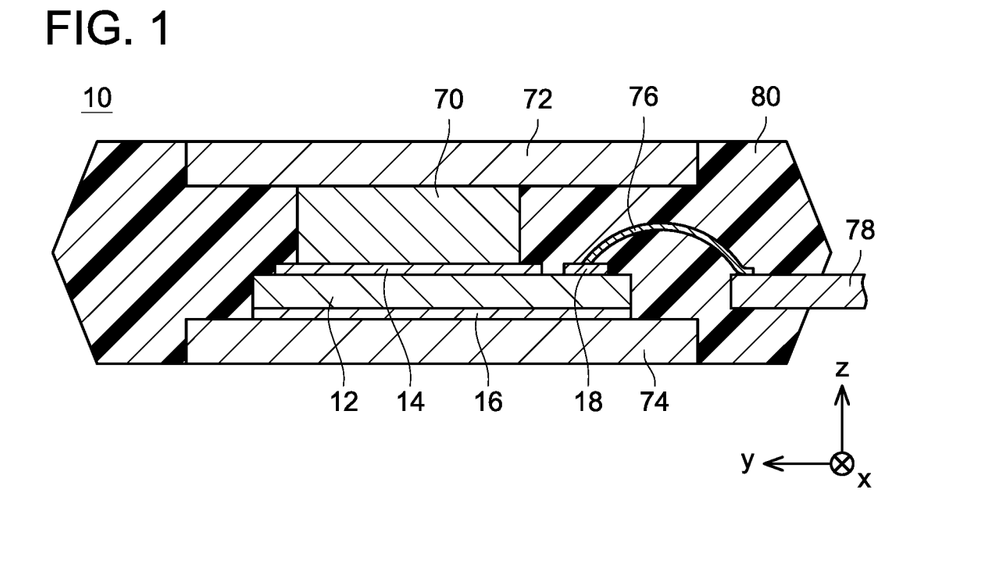
FIG. 1 is a cross-sectional view of a semiconductor device.

FIG. 1 shows a semiconductor device 10 of a first embodiment. As shown in FIG. 1, the semiconductor device 10 includes a semiconductor substrate 12. In the following description, an x direction means a direction parallel to the semiconductor substrate 12, a y direction means a direction parallel to the semiconductor substrate 12 and perpendicular to the x direction, and a z direction means a direction normal to the semiconductor substrate 12.

Figure 2:
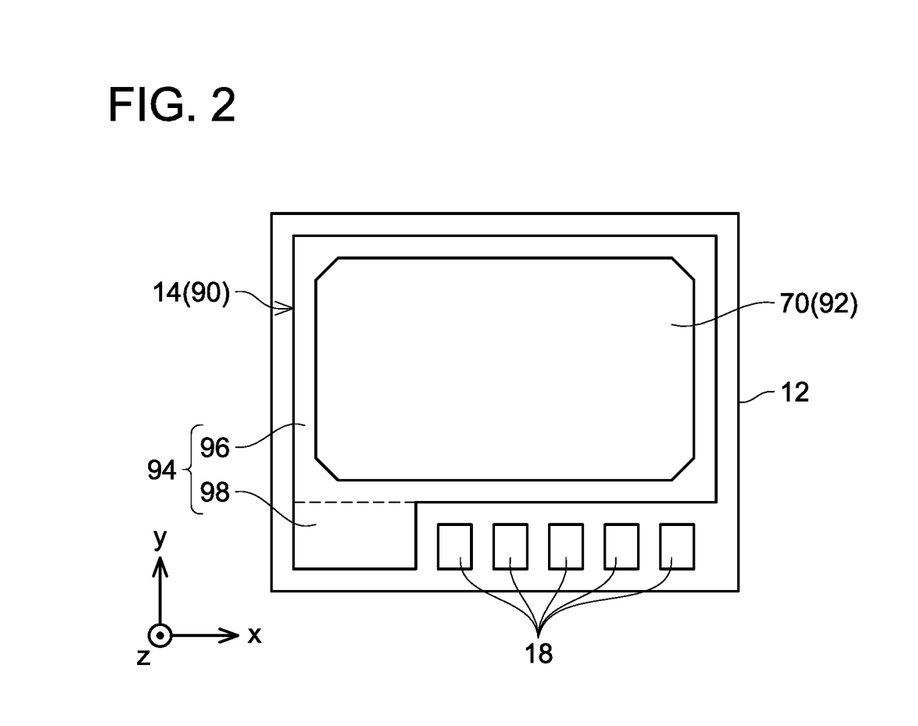
FIG. 2 is a planar view of a semiconductor substrate and a terminal 70 from above.

The semiconductor substrate 12 is constituted of a single crystal of silicon carbide (SiC). The semiconductor substrate 12 includes switching elements therein. An upper surface of the semiconductor substrate 12 is provided with an upper electrode 14 and signal electrodes 18. As shown in FIG. 2, a plurality of signal electrodes 18 is provided on the upper surface of the semiconductor substrate 12. As shown in FIG. 1, a lower surface of the semiconductor substrate 12 is provided with a lower electrode 16. The lower electrode 16 covers the entirety of the lower surface of the semiconductor substrate 12.

As shown in FIG. 1, a terminal 70 is disposed above the upper electrode 14. The terminal 70 is a metal block. The terminal 70 is connected to the upper electrode 14 via a solder layer which is not shown. A heat dissipating plate 72 is disposed above the terminal 70. The heat dissipating plate 72 is a metal plate. The heat dissipating plate 72 is connected to the terminal 70 via a solder layer which is not shown. The heat dissipating plate 72 releases heat from the semiconductor substrate 12. The heat dissipating plate 72 also functions as an electrode plate connected to the semiconductor substrate 12.

Each of the signal electrodes 18 is connected to corresponding one of signal terminals 78 via a bonding wire 76.

Various signals for controlling the switching elements are inputted to and outputted from the signal electrodes 18.

A heat dissipating plate 74 is disposed below the lower electrode 16. The heat dissipating plate 74 is a metal plate. The heat dissipating plate 74 is connected to the lower electrode 16 via a solder layer which is not shown. The heat dissipating plate 74 releases heat from the semiconductor substrate 12. The heat dissipating plate 74 also functions as an electrode plate connected to the semiconductor substrate 12.

The semiconductor substrate 12, the terminal 70, and the heat dissipating plates 72, 74 are covered by an insulating resin 80 in their peripheries.

FIG. 2 shows an arrangement of the upper electrode 14, the signal electrodes 18, and the terminal 70 in a planar view of the semiconductor substrate 12 from above. As shown in FIG. 2, the upper electrode 14 is provided over a wide area in the upper surface of the semiconductor substrate 12. The plurality of signal electrodes 18 is provided in an area where the upper electrode 14 is not provided. The terminal 70 covers most of the upper electrode 14. A part of the upper electrode 14 is disposed outside the terminal 70. As will be described later in detail, the switching elements are provided in a semiconductor region under the upper electrode 14. The semiconductor region under the upper electrode 14 will hereinafter be termed an active region 90. Moreover, a part of the active region 90 that is covered by the terminal 70 will be termed a main region 92, and a part of the active region 90 that is not covered by the terminal 70 will be termed an external region 94. As shown in FIG. 2, the external region 94 includes a portion 96 around the terminal 70 and a portion 98 adjacent to the plurality of signal electrodes 18. The portion 96 will hereinafter be termed a peripheral region. As will be described later in detail, a current is less likely to flow in the portion 98 than in the main region 92 and the peripheral region 96. The portion 98 will hereinafter be termed a low current region 98.

As shown in FIG. 2, the signal electrodes 18 are located in the y direction relative to the main region 92. The low current region 98 protrudes in the y direction from the main region 92 and the peripheral region 96. In other words, the low current region 98 is located in the y direction relative to the main region 92. Moreover, the low current region 98 is located in the x direction relative to the plurality of signal electrodes 18.

Figure 3:
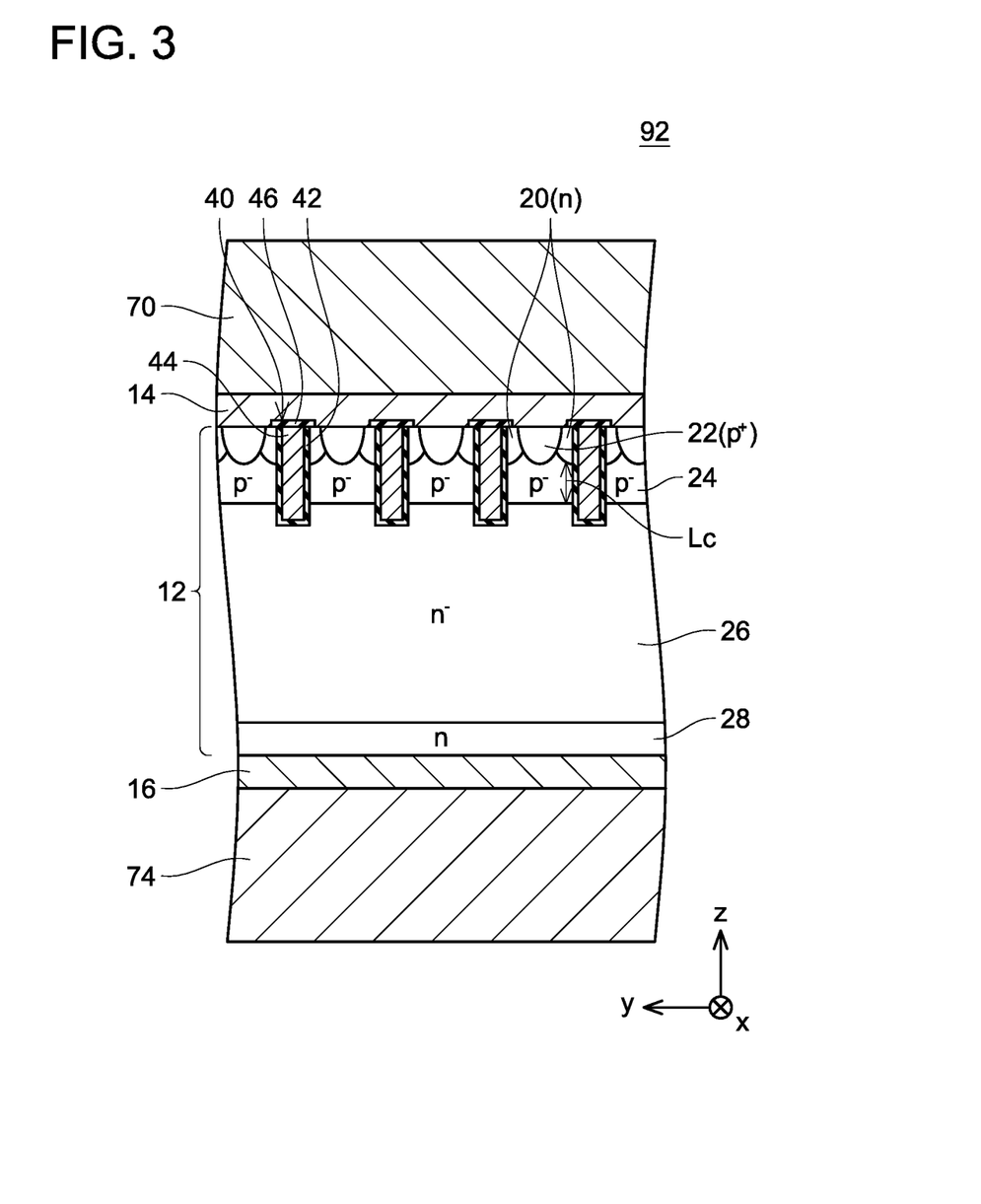
FIG. 3 is a cross-sectional view of a main region.
Figure 4:
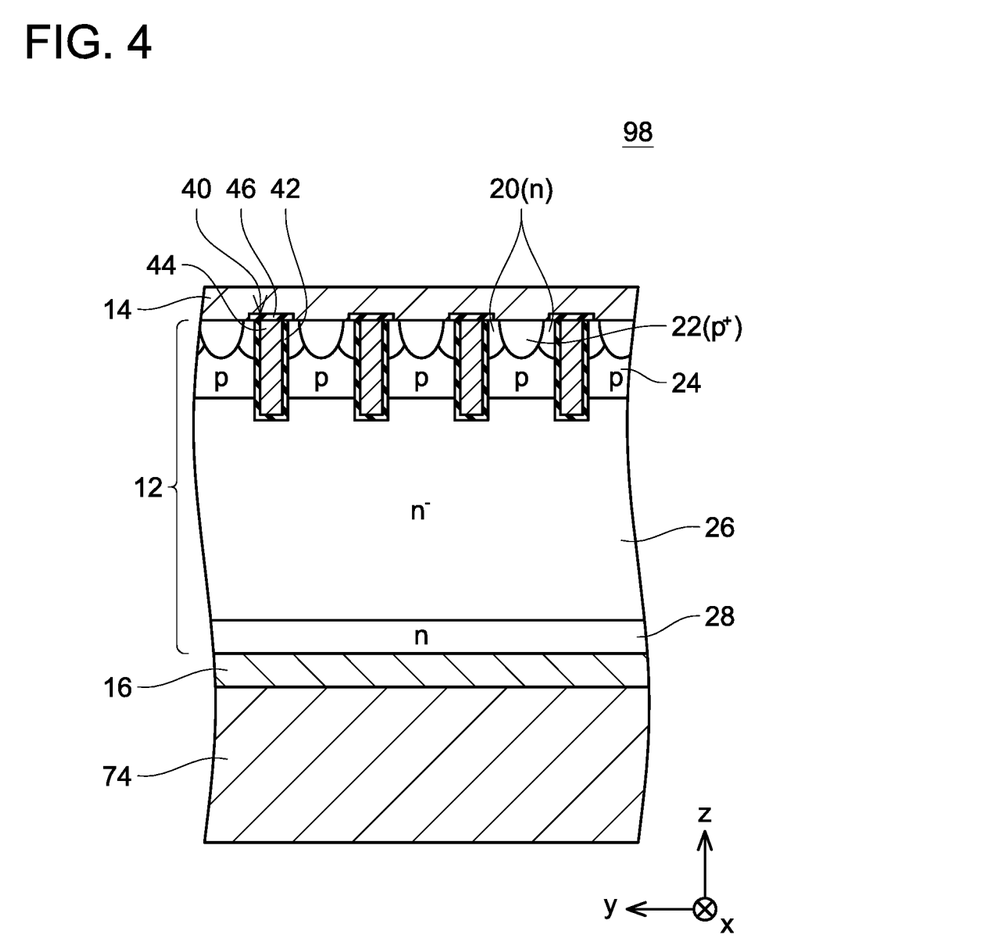
FIG. 4 is a cross-sectional view of a low current region according to a first embodiment.

FIG. 3 shows a cross-sectional structure of the main region 92. The peripheral region 96 has the same cross-sectional structure as that in FIG. 3. FIG. 4 shows a cross-sectional structure of the low current region 98. Firstly, a structure common to the main region 92 and the low current region 98 will hereinafter be described.

As shown in FIGS. 3 and 4, trenches 40 are provided in the upper surface of the semiconductor substrate 12 within the main region 92 and the low current region 98. The trenches 40 extend long in the x direction in the upper surface of the semiconductor substrate 12. Each trench 40 has its inner surface covered by a gate insulating film 42. Each trench 40 has a gate electrode 44 disposed therein. The gate electrodes 44 are insulated from the semiconductor substrate 12 by their corresponding gate insulating films 42. Each gate electrode 44 has its upper surface covered by an interlayer insulating film 46. The gate electrodes 44 are insulated from the upper electrode 14 by their corresponding interlayer insulating films 46.

As shown in FIGS. 3 and 4, the semiconductor substrate 12 within the main region 92 and the low current region 98 includes a plurality of source regions 20, a plurality of contact regions 22, a body region 24, a drift region 26, and a drain region 28.

As shown in FIGS. 3 and 4, each source region 20 is a region of n-type. The source regions 20 are disposed in semiconductor regions interposed between adjacent trenches 40 (which will hereinafter be termed inter-trench semiconductor regions). Two source regions 20 are provided in each inter-trench semiconductor region. The source regions 20 are in ohmic contact with the upper electrode 14. Each source region 20 is in contact with its corresponding gate insulating film 42 at an upper end portion of the trench 40.

As shown in FIGS. 3 and 4, each contact region 22 is a region of p-type. The contact regions 22 are disposed in the inter-trench semiconductor regions. One contact region 22 is provided in each inter-trench semiconductor region. Each contact region 22 is in ohmic contact with the upper electrode 14 in an area where the source regions 20 are not provided.

As shown in FIGS. 3 and 4, the body region 24 is a region of p-type. A p-type impurity concentration in the body region 24 is lower than a p-type impurity concentration in the contact regions 22. The body region 24 is distributed across the inter-trench semiconductor regions. In each inter-trench semiconductor region, the body region 24 is in contact with the source regions 20 and the contact region 22 from below. The body region 24 is in contact with the gate insulating films 42 below the source regions 20.

As shown in FIGS. 3 and 4, the drift region 26 is a region of n-type. An n-type impurity concentration in the drift region 26 is lower than an n-type impurity concentration in the source regions 20. The drift region 26 is in contact with the body region 24 from below. The drift region 26 is in contact with the gate insulating films 42 below the body region 24.

As shown in FIGS. 3 and 4, the drain region 28 is a region of n-type. An n-type impurity concentration in the drain region 28 is higher than the n-type impurity concentration in the drift region 26. The drain region 28 is in contact with the drift region 26 from below. The drain region 28 is in contact with the lower electrode 16.

Each of the main region 92, the peripheral region 96, and the low current region 98 is provided with switching elements (more specifically, n-channel metal oxide semiconductor field effect transistors (MOSFETs)) which are each constituted of the source regions 20, the contact regions 22, the body region 24, the drift region 26, the drain region 28, the gate insulating films 42, the gate electrodes 44, and the like. The gate electrodes 44 in the main region 92, the peripheral region 96, and the low current region 98 are connected to one another by gate wiring which is not shown. Thus, a common gate voltage is applied to the gate electrodes 44 in the main region 92, the gate electrodes 44 in the peripheral region 96, and the gate electrodes 44 in the low current region 98.

Next, structural differences between the main region 92 and the low current region 98 will be described. As shown in FIGS. 3 and 4, the p-type impurity concentration in the body region 24 in the low current region 98 is higher than the p-type impurity concentration in the body region 24 in the main region 92. Thus, a gate threshold of the switching elements in the low current region 98 is higher than a gate threshold of the switching elements in the main region 92.

Moreover, as described above, the upper electrode 14 is connected to the terminal 70 in the main region 92, whereas the upper electrode 14 is not connected to the terminal 70 in the low current region 98. Thus, heat dissipating performance of the low current region 98 is lower than heat dissipating performance of the main region 92.

When the switching elements in the main region 92, the peripheral region 96, and the low current region 98 are to be turned on, the potential of each gate electrode 44 is increased to a potential higher than the gate threshold of the switching elements in the low current region 98. As a result of the potential increase, channels are formed in portions of the body region 24 that are in contact with the gate insulating films 42 in each of the main region 92, the peripheral region 96, and the low current region 98, and the channels connects the drift region 26 to the source regions 20. Consequently, a current flows from the lower electrode 16 to the upper electrode 14 via the drain region 28, the drift region 26, the channels, and the source regions 20. Since the gate threshold of the switching elements in the low current region 98 is higher than the gate threshold of the switching elements in the main region 92 and the peripheral region 96, the resistance of the channels formed in the low current region 98 is higher than the resistance of the channels formed in the main region 92 and the peripheral region 96. Thus, the density of current flowing in the low current region 98 is lower than the density of current flowing in the main region 92 and the peripheral region 96. As a result, an amount of heat generated per unit area in the low current region 98 is smaller than an amount of heat generated per unit area in the main region 92 and the peripheral region 96. As described above, since the terminal 70 is connected to the upper electrode 14 in the main region 92, the main region 92 exhibits high heat dissipating performance. Moreover, since the peripheral region 96 is disposed around the main region 92 (i.e., the terminal 70), the peripheral region 96 exhibits relatively high heat dissipating performance. Thus, even when a large amount of heat is generated in the main region 92 and the peripheral region 96, temperature increase in the main region 92 and the peripheral region 96 is suppressed. Moreover, as described above, since the terminal 70 is not connected to the upper electrode 14 in the low current region 98, the low current region 98 exhibits low heat dissipating performance. However, the amount of heat generated in the low current region 98 is small, and hence temperature increase in the low current region 98 is suppressed.

As described above, in the semiconductor device 10 of the first embodiment, temperature increase is suppressed in all of the main region 92, the peripheral region 96, and the low current region 98. In the first embodiment, in particular, a ratio between the current density in the main region 92 and the current density in the low current region 98 is set such that the temperature of a central portion of the main region 92 becomes a little higher than the temperature of the low current region 98. Thus, the semiconductor device 10 can allow a current to flow until the main region 92 reaches a high temperature, without being affected by the temperature of the low current region 98. Moreover, in this semiconductor device 10, when a current flows in the main region 92, a current also flows in the low current region 98. Due to this, the semiconductor device 10 can allow a higher current to flow through, compared to a configuration in which the low current region 98 is not provided.

Moreover, in the first embodiment, the low current region 98 is provided in the area which is located in the x direction relative to the plurality of signal electrodes 18 and is located in the y direction relative to the main region 92, as shown in FIG. 2. Providing the low current region 98 in a space adjacent to the plurality of signal electrodes 18 enables the semiconductor substrate 12 to be utilized more efficiently, and enables a higher current to flow in the semiconductor substrate 12.

Second Embodiment

Next, a semiconductor device of a second embodiment will be described. A main region 92 and a peripheral region 96 of the semiconductor device according to the second embodiment have the same structures as those of the main region 92 and the peripheral region 96 according to the first embodiment (the structure in FIG. 3). The structure of a low current region 98 of the semiconductor device according to the second embodiment differs from that of the first embodiment (the structure in FIG. 4).

Figure 5:
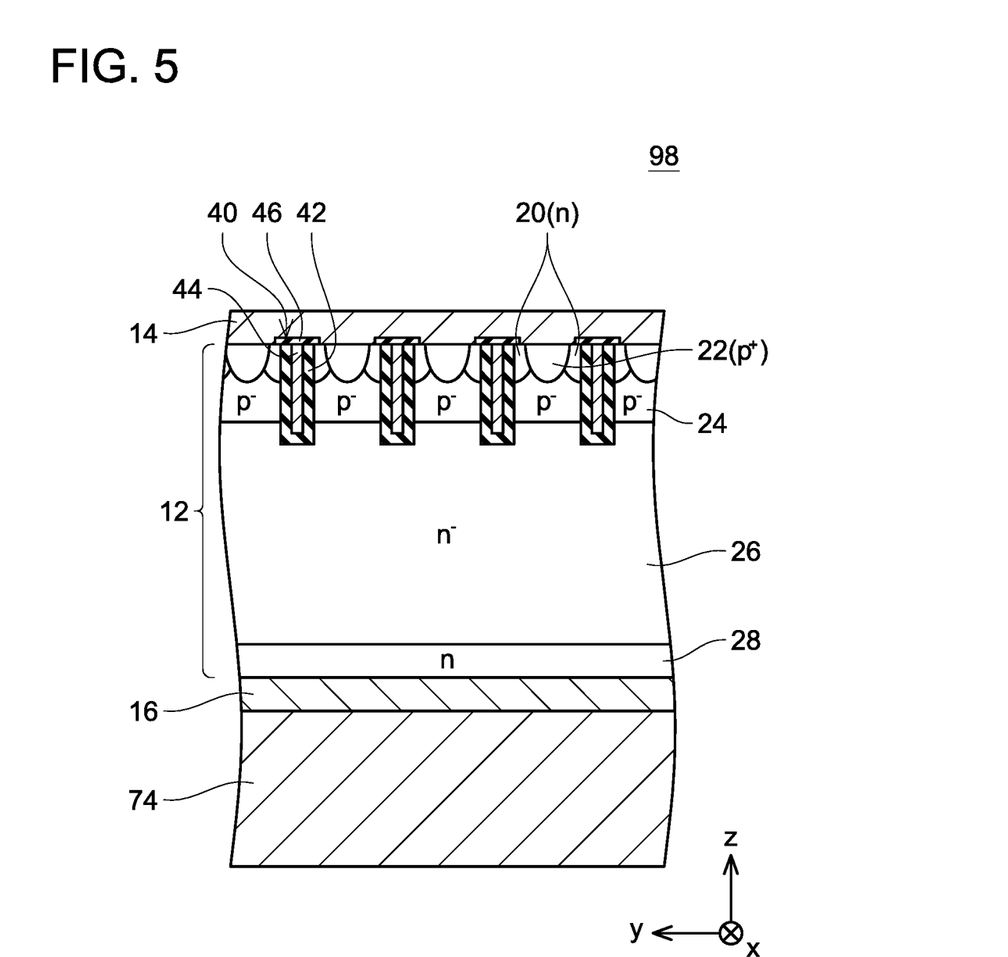
FIG. 5 is a cross-sectional view of a low current region according to a second embodiment.

FIG. 5 shows the structure of the low current region 98 of the semiconductor device according to the second embodiment. As is apparent from comparison between FIGS. 3 and 5, in the semiconductor device of the second embodiment, the gate insulating films 42 in the low current region 98 are thicker than the gate insulating films 42 in the main region 92. Moreover, in the semiconductor device of the second embodiment, the p-type impurity concentration in the body region 24 in the low current region 98 is equal to the p-type impurity concentration in the body region 24 in the main region 92. Except for the above differences, the structure of the low current region 98 in the second embodiment is the same as the structure of the low current region 98 in the first embodiment.

As described above, in the second embodiment, the gate insulating films 42 in the low current region 98 are thicker than the gate insulating films 42 in the main region 92. Thus, the gate threshold of the switching elements in the low current region 98 is higher than the gate threshold of the switching elements in the main region 92. Due to this, when the switching elements are turned on, the density of current flowing in the low current region 98 is lower than the density of current flowing in the main region 92 and the peripheral region 96 in the second embodiment as well, as in the first embodiment. Consequently, an amount of heat generated per unit area in the low current region 98 is smaller than an amount of heat generated per unit area in each of the main region 92 and the peripheral region 96. Thus, temperature increase in the low current region 98, which has low heat dissipating performance, is suppressed.

In the second embodiment, a ratio between the current density in the main region 92 and the current density in the low current region 98 is set such that the temperature of the central portion of the main region 92 becomes a little higher than the temperature of the low current region 98, as in the first embodiment. Thus, the semiconductor device can allow a current to flow therethrough without being affected by the temperature of the low current region 98. Moreover, in the second embodiment, a current can flow not only in the main region 92 and the peripheral region 96 but also in the low current region 98, as in the first embodiment. Thus, the semiconductor device can allow a higher current to flow therethrough compared to a configuration in which the low current region 98 is not provided.

Third Embodiment

Next, a semiconductor device of a third embodiment will be described. A main region 92 and a peripheral region 96 of the semiconductor device according to the third embodiment have the same structures as those of the main region 92 and the peripheral region 96 according to the first embodiment (the structure in FIG. 3). The structure of a low current region 98 of the semiconductor device according to the third embodiment differs from that of the first embodiment (the structure in FIG. 4).

Figure 6:
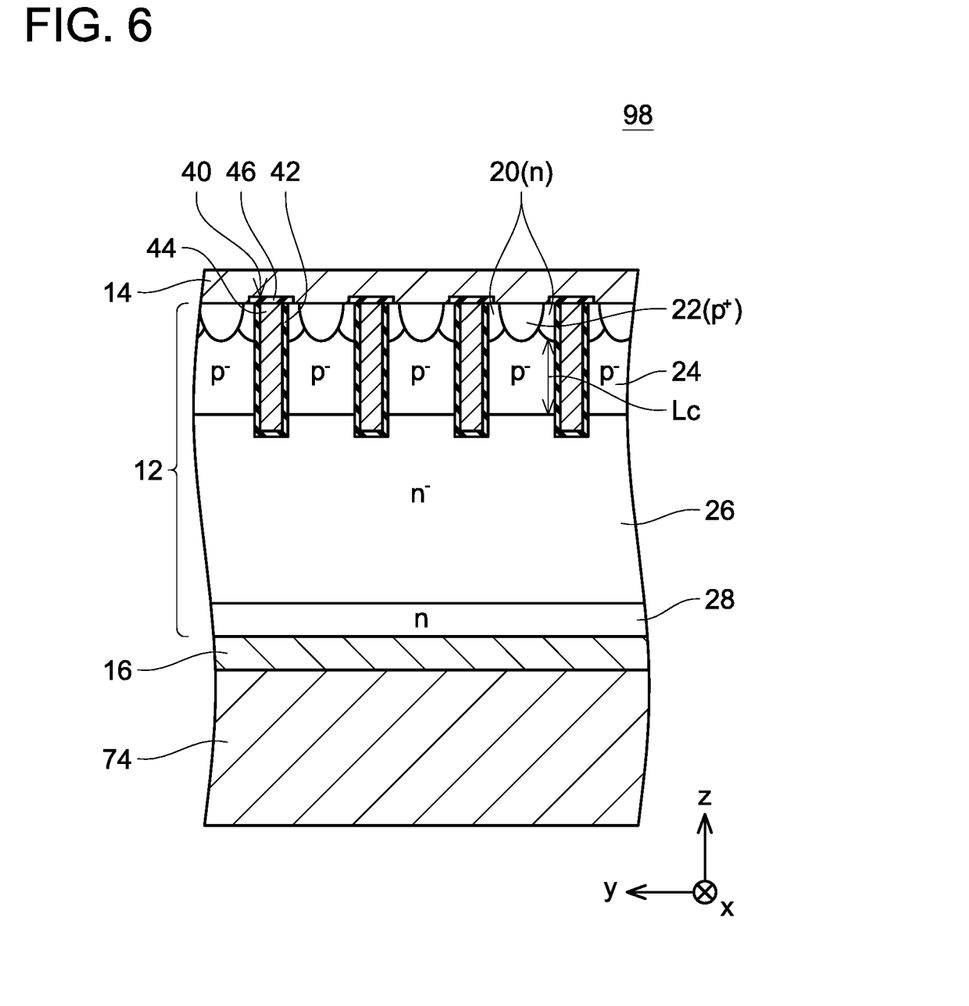
FIG. 6 is a cross-sectional view of a low current region according to a third embodiment.

FIG. 6 shows the structure of the low current region 98 of the semiconductor device according to the third embodiment. As is apparent from comparison between FIGS. 3 and 6, in the semiconductor device of the third embodiment, the thickness of the body region 24 in the low current region 98 is thicker than the thickness of the body region 24 in the main region 92. The trenches 40 in the low current region 98 penetrate the thick body region 24. Thus, a distance Lc of an interval between the source region 20 and the drift region 26 along the gate insulating film 42 (so-called channel length) is longer in the low current region 98 than in the main region 92. Moreover, in the third embodiment, the thickness of the drift region 26 in the low current region 98 is thinner than the thickness of the drift region 26 in the main region 92. Furthermore, in the semiconductor device of the third embodiment, the p-type impurity concentration in the body region 24 in the low current region 98 is equal to the p-type impurity concentration in the body region 24 in the main region 92. Except for the above differences, the structure of the low current region 98 in the third embodiment is the same as the structure of the low current region 98 in the first embodiment.

As described above, in the third embodiment, the channel length Lc in the low current region 98 is longer than the channel length Lc in the main region 92. Moreover, since the channel length Lc is longer, the thickness of the drift region 26 in the low current region 98 is thinner than the thickness of the drift region 26 in the main region 92. In such a configuration, the resistance of a current path in the low current region 98 is higher than the resistance of a current path in the main region 92, when the switching elements are turned on. Thus, when the switching elements are turned on, the density of current flowing in the low current region 98 is lower than the density of current flowing in the main region 92 and the peripheral region 96 in the third embodiment as well, as in the first embodiment. Consequently, an amount of heat generated per unit area in the low current region 98 becomes smaller than an amount of heat generated per unit area in the main region 92 and the peripheral region 96. Therefore, temperature increase in the low current region 98, which has low heat dissipating performance, is suppressed.

In the third embodiment, a ratio between the current density in the main region 92 and the current density in the low current region 98 is set such that the temperature of the central portion of the main region 92 becomes a little higher than the temperature of the low current region 98, as in the first embodiment. Thus, the semiconductor device can allow a current to flow therethrough without being affected by the temperature of the low current region 98. Moreover, in the third embodiment, a current can flow not only in the main region 92 and the peripheral region 96 but also in the low current region 98, as in the first embodiment. Thus, the semiconductor device can allow a higher current to flow therethrough as compared to a configuration in which the low current region 98 is not provided.

The configurations of the first to third embodiments described above may be combined. For example, the main region 92 and the low current region 98 may be differentiated from each other in the p-type impurity concentration in the body region 24, thickness of the gate insulating films 42, and channel length, so as to make the current density in the low current region 98 lower than the current density in the main region 92.

Figure 7:
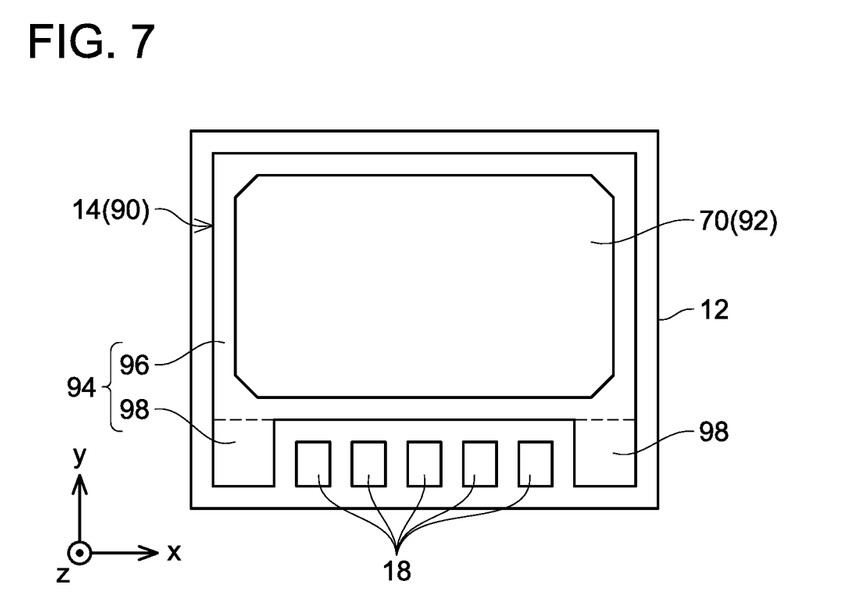
FIG. 7 is a planar view showing a variant with modified arrangement of low current region.
Figure 8:
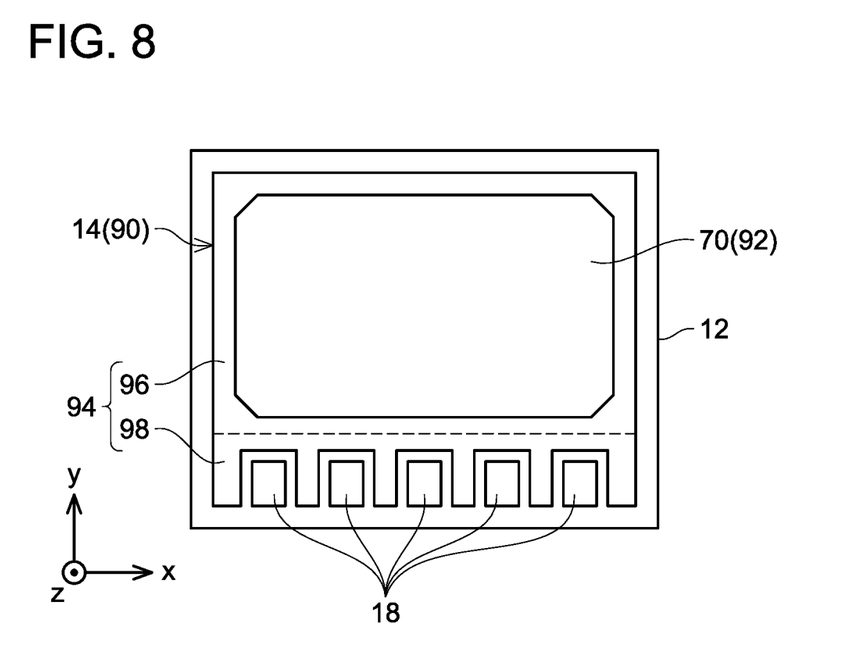
FIG. 8 is a planar view showing a variant with modified arrangement of low current region.

In the first to third embodiments described above, the low current region 98 is provided on one side of the area where the signal electrodes 18 are provided, as shown in FIG. 2. As shown in FIG. 7, however, the low current regions 98 may be provided respectively on both sides of the area where the signal electrodes 18 are provided. Moreover, as shown in FIG. 8, the low current region 98 may be provided in areas between the signal electrodes 18.

Figure 9:
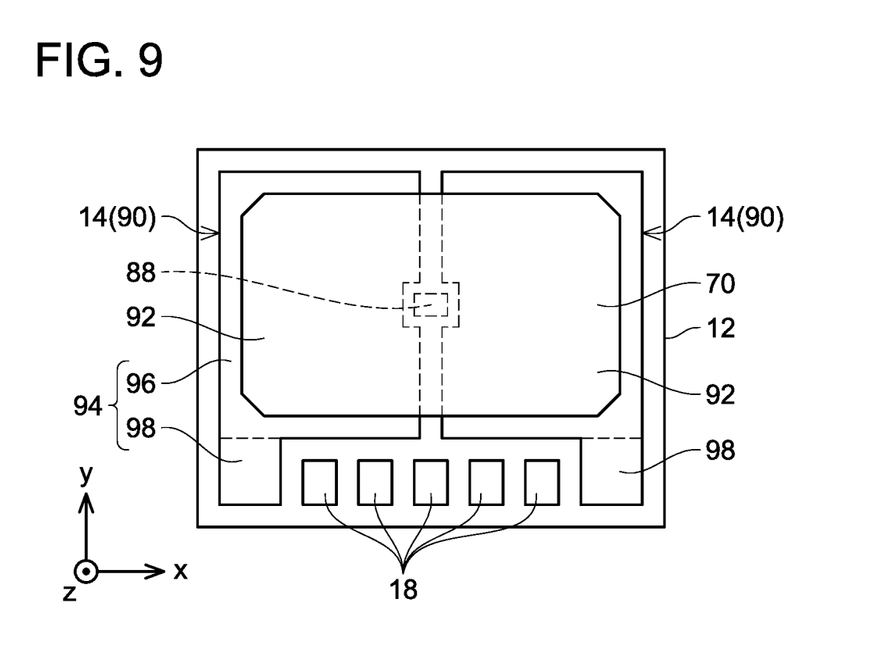
FIG. 9 is a planar view showing a variant with a temperature sensor.

As shown in FIG. 9, a temperature sensor 88 may be provided in an area that overlaps the terminal 70. In the configuration of FIG. 9, the upper electrode 14 is divided into two. The temperature sensor 88 is provided at a position between the two upper electrodes 14. The temperature sensor 88 is interposed between the semiconductor substrate 12 and the terminal 70. The temperature sensor 88 is provided in a central portion of the semiconductor substrate 12. The temperature sensor 88 is configured to detect a temperature of the main region 92. Setting the temperature of the low current regions 98 to become lower than the temperature of the main region 92 enables the temperature sensor 88 to detect the temperature of the main region 92, which becomes high in the semiconductor substrate 12. This enables suitable detection of overheat of the semiconductor substrate 12 by the temperature sensor 88.

Relations between constituent elements in the above-described embodiments and constituent elements in the claims will be described. The source regions in the embodiments are examples of a first region in the claims. The drift region in the embodiments is an example of a second region in the claims.

Some of the features disclosed herein will be listed. It should be noted that the respective technical elements are independent of one another, and are useful solely or in combinations.

In an aspect of semiconductor device disclosed herein, the semiconductor device may further comprise a signal electrode provided on the upper surface of the semiconductor substrate and outside the active region. In a planar view of the upper surface of the semiconductor substrate, a first direction may be defined as a direction from the main region to the signal electrode, a second direction may be defined as a direction perpendicular to the first direction, and the low current region may be located in the first direction relative to the main region and is located in the second direction relative to the signal electrode.

This configuration enables a space in the semiconductor substrate to operate as the low current region.

In an aspect of semiconductor device disclosed herein, the semiconductor device may further comprise a temperature sensor configured to sense a temperature of the main region.

This configuration enables temperature detection for a high temperature portion in the semiconductor substrate.

In an aspect of semiconductor device disclosed herein, the switching elements in the active region may each comprise a first region of n-type, a body region of p-type, a second region of n-type separated from the first region by the body region, a gate insulating film, and a gate electrode opposed to the body region via the gate insulating film. In this case, a p-type impurity concentration in the body region in the low current region may be higher than a p-type impurity concentration in the body region in the main region. Moreover, a thickness of the gate insulating film in the low current region may be thicker than a thickness of the gate insulating film in the main region. Furthermore, an interval between the first region and the second region in the low current region may be longer than an interval between the first region and the second region in the main region.

These configurations enable the current density in the low current region to be lower than the current density in the main region.

In an aspect of semiconductor device disclosed herein, the semiconductor substrate may be constituted of silicon carbide (SiC).

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A semiconductor device, comprising:
    a semiconductor substrate;
    an upper electrode provided on an upper surface of the semiconductor substrate;
    a lower electrode provided on a lower surface of the semiconductor substrate; and
    a terminal connected to the upper electrode,
    wherein
    the semiconductor substrate comprises an active region in which switching elements are provided, the switching elements being configured to pass a current between the upper electrode and the lower electrode,
    the active region comprises a main region located under the terminal and an external region located outside the main region,
    the external region comprises a low current region, and
    a current density in the low current region is lower than a current density in the main region in a case where the switching elements in the low current region and the main region are turned on.

2. The semiconductor device of claim 1, further comprising a signal electrode provided on the upper surface of the semiconductor substrate and outside the active region,
    wherein
    in a planar view of the upper surface of the semiconductor substrate, a first direction is defined as a direction from the main region to the signal electrode, and a second direction is defined as a direction perpendicular to the first direction, and
    the low current region is located in the first direction relative to the main region and is located in the second direction relative to the signal electrode.

3. The semiconductor device of claim 1, further comprising a temperature sensor configured to sense a temperature of the main region.

4. The semiconductor device of claim 1, wherein the switching elements in the active region each comprise:
    a first region of n-type;
    a body region of p-type;
    a second region of n-type separated from the first region by the body region;
    a gate insulating film; and
    a gate electrode opposed to the body region via the gate insulating film.

5. The semiconductor device of claim 4, wherein a p-type impurity concentration in the body region in the low current region is higher than a p-type impurity concentration in the body region in the main region.

6. The semiconductor device of claim 4, wherein a thickness of the gate insulating film in the low current region is thicker than a thickness of the gate insulating film in the main region.

7. The semiconductor device of claim 4, wherein an interval between the first region and the second region in the low current region is longer than an interval between the first region and the second region in the main region.

8. The semiconductor device of claim 1, wherein the semiconductor substrate is constituted of silicon carbide (SiC).

* * * * *